United States Patent
Refai-Ahmed et al.

(10) Patent No.: US 9,951,767 B2
(45) Date of Patent: Apr. 24, 2018

(54) VIBRATIONAL FLUID MOVER ACTIVE CONTROLLER

(71) Applicant: General Electric Company, Schenectady, NY (US)

(72) Inventors: Gamal Refai-Ahmed, Albany, NY (US); John Anthony Vogel, Charlton, NY (US); Christian M. Giovanniello, Schenectady, NY (US)

(73) Assignee: General Electric Company, Schenectady, NY (US)

( * ) Notice: Subject to any disclaimer, the term of this patent is extended or adjusted under 35 U.S.C. 154(b) by 742 days.

(21) Appl. No.: 14/284,782

(22) Filed: May 22, 2014

(65) Prior Publication Data
US 2015/0337828 A1 Nov. 26, 2015

(51) Int. Cl.
*F04B 49/06* (2006.01)
*F04B 45/047* (2006.01)
(Continued)

(52) U.S. Cl.
CPC ............ *F04B 49/065* (2013.01); *F04B 43/04* (2013.01); *F04B 45/047* (2013.01); *F04F 7/00* (2013.01);
(Continued)

(58) Field of Classification Search
CPC .... F04B 17/003; F04B 43/046; F04B 43/095; F04B 43/04; F04B 49/065; F04B 45/047;
(Continued)

(56) References Cited

U.S. PATENT DOCUMENTS

| | | | |
|---|---|---|---|
| 6,588,497 B1 * | 7/2003 | Glezer | F15D 1/009 165/84 |
| 6,713,901 B2 * | 3/2004 | Hassan | B64C 21/02 310/12.01 |

(Continued)

FOREIGN PATENT DOCUMENTS

CN 202652794 U 1/2013

OTHER PUBLICATIONS

European Search Report and Opinion issued in connection with corresponding EP Application No. 15168633.4 dated Nov. 19, 2015.
(Continued)

*Primary Examiner* — Nathan Zollinger
(74) *Attorney, Agent, or Firm* — Ziolkowski Patent Solutions Group, SC; Jean K. Testa (57) ABSTRACT

A vibrational fluid mover includes a housing having at least one actuator element positioned thereon that vibrates responsive to a wave shape voltage applied thereto, such that a volume of a chamber in the housing increases and decreases to entrain and eject fluid into/out from the chamber. A control system is operably connected to the actuator element to cause the voltage to be provided thereto so as to actively control the movement of the actuator element. The control system is programmed to set a baseline value for an operational parameter of the vibrational fluid mover generated responsive to a target voltage and frequency being provided, monitor operation of the vibrational fluid mover during operation at the target voltage and frequency, identify a deviation of the operational parameter from the baseline value, and modify the voltage and frequency provided to the actuator element based on any deviation of the operational parameter.

14 Claims, 5 Drawing Sheets

(51) Int. Cl.
*F04B 43/04* (2006.01)
*F04F 7/00* (2006.01)
*H01L 23/467* (2006.01)

(52) U.S. Cl.
CPC .... *H01L 23/467* (2013.01); *H01L 2924/0002* (2013.01)

(58) Field of Classification Search
CPC ... F04F 7/00; H01L 23/467; H01L 2924/0002
See application file for complete search history.

(56) References Cited

U.S. PATENT DOCUMENTS

| | | | | |
|---|---|---|---|---|
| 7,094,040 B2* | 8/2006 | Higashino | ............ | F04B 43/043 417/413.2 |
| 7,315,109 B1* | 1/2008 | Griffiths | ................. | F03G 7/065 310/300 |
| 7,564,164 B2* | 7/2009 | Yamamoto | ............ | F04B 17/003 310/317 |
| 8,035,966 B2* | 10/2011 | Reichenbach | ..... | G05D 23/1917 181/206 |
| 8,290,724 B2 | 10/2012 | Darbin et al. | | |
| 8,292,800 B2* | 10/2012 | Stone | .................... | A61F 5/0053 600/37 |
| 8,336,402 B2* | 12/2012 | Glezer | ................. | G01N 1/2273 73/23.34 |
| 8,418,934 B2 | 4/2013 | Arik et al. | | |
| 9,570,643 B2* | 2/2017 | Myers | ................... | H01L 31/052 |
| 2005/0121171 A1 | 6/2005 | Mukasa et al. | | |
| 2011/0141691 A1 | 6/2011 | Slaton et al. | | |
| 2012/0046674 A1* | 2/2012 | Augarten | .............. | A61F 5/0059 606/151 |
| 2012/0073788 A1 | 3/2012 | Streyle | | |
| 2012/0109099 A1* | 5/2012 | Rogers | ............. | A61M 5/14216 604/500 |
| 2012/0170216 A1 | 7/2012 | Arik et al. | | |
| 2014/0049970 A1 | 2/2014 | de Bock et al. | | |

OTHER PUBLICATIONS

Song et al., "Hierarchical Life Prediction Model for Actively Cooled LED-Based Luminaire," IEEE Transactions on Components and Packaging Technologies, vol. 33, No. 4, Dec. 2010, pp. 728-737.

Ramabhadran et al., "A Low Power Consumption Driver With Low Acoustics for Piezoelectric Synthetic Jets," Energy Conversion Congress and Exposition (ECCE), 2013 IEEE, Denver, CO, Sep. 15-19, 2013, pp. 2692-2697.

* cited by examiner

VIBRATIONAL FLUID MOVER ACTIVE CONTROLLER

BACKGROUND OF THE INVENTION

Embodiments of the invention relate generally to synthetic jet actuators, and more specifically to systems and methods for controlling operation of synthetic jet actuators in order to operate the synthetic jet actuator at an optimal operating point with respect to acoustic operating noise, efficiency, operating temperature, and maximizing longevity of the actuator.

Synthetic jet actuators are a widely-used technology that generates a synthetic jet of fluid to influence the flow of that fluid over a surface. A typical synthetic jet actuator comprises a housing defining an internal chamber. An orifice is present in a wall of the housing. The actuator further includes a mechanism in or about the housing for periodically changing the volume within the internal chamber so that a series of fluid vortices are generated and projected in an external environment out from the orifice of the housing. One example of a volume changing mechanism is a flexible diaphragm that forms a wall of the housing, with the flexible diaphragm being actuated by a piezoelectric actuator or other appropriate means. In a dual cool jet (DCJ) construction, two piezoelectric actuators (or other suitable actuators) cause deflection of opposing flexible diaphragm walls of the housing in order to change the volume within the internal chamber of the housing.

Typically, a control system is used to create time-harmonic motion of the volume changing mechanism. As the mechanism decreases the chamber volume, fluid is ejected from the chamber through the orifice. As the fluid passes through the orifice, sharp edges of the orifice separate the flow to create vortex sheets that roll up into vortices. These vortices move away from the edges of the orifice under their own self-induced velocity. As the mechanism increases the chamber volume, ambient fluid is drawn into the chamber from large distances from the orifice. Since the vortices have already moved away from the edges of the orifice, they are not affected by the ambient fluid entering into the chamber. As the vortices travel away from the orifice, they synthesize a jet of fluid, i.e., a "synthetic jet."

While synthetic jet actuators are generally recognized as being durable cooling devices, it is recognized that they can be subjected to a range of environment conditions during use and that this can lead to degradation and eventual failure of the synthetic jet actuators. If possible, it is highly desirable to prevent such failures from occurring, as the replacement of synthetic jet actuators can be time consuming and, in some cases, can also necessitate shutdown of the system or components to which the synthetic jet actuators are designed to provide cooling to. It is recognized that altering operation of a synthetic jet actuator (e.g., reducing input power, operating voltage, operating frequency, etc.) can help to prolong the life thereof; however, it is also recognized that certain operational/system requirements may be present that would restrict how the operation of the synthetic jet actuator can be altered—including temperature requirements and acoustic level requirements, for example.

Accordingly, it would be desirable to provide a system and method for monitoring the operating conditions of a synthetic jet actuator in order to identify degradation and a potential failure of the synthetic jet actuator, so as to enable adjustment of the operating parameters of the synthetic jet actuator to counteract degradation and prevent premature failure. It would also be desirable for such a system and method to—in adjusting the operating parameters of the synthetic jet actuator to counteract degradation and prevent premature failure—determine a manner in which to implement such adjustments that optimizes performance of the synthetic jet actuator with respect to meeting temperature requirements and acoustic level requirements.

BRIEF DESCRIPTION OF THE INVENTION

In accordance with one aspect of the invention, a vibrational fluid mover includes a housing defining a chamber, the housing having at least one orifice formed therein. The vibrational fluid mover also includes at least one actuator element positioned on the housing that moves in a time harmonic fashion responsive to a form of wave shape voltage applied thereto, such that a volume of the chamber increases and decreases to entrain fluid into the chamber and eject a jet of fluid out from the at least one orifice. The vibrational fluid mover further includes a control system operably connected to the at least one actuator element to cause the form of wave shape voltage to be provided thereto so as to actively control the time harmonic movement of the at least one actuator element, wherein the control system is programmed to set a baseline value for an operational parameter of the vibrational fluid mover generated responsive to a target voltage and frequency being provided to the at least one actuator element, monitor operation of the vibrational fluid mover during continued operation thereof at the target voltage and frequency, identify a deviation of the operational parameter from the baseline value during the continued operation thereof at the target voltage and frequency, and modify the voltage and frequency provided to the at least one actuator element based on the identified deviation of the operational parameter from the baseline value.

In accordance with another aspect of the invention, a control system for providing active control of a synthetic jet actuator includes a processor programmed to receive an initial feedback from a sensing circuit comprising measurements of one or more operational parameters of a synthetic jet actuator, the measurements of the one or more operational parameters resulting from operation of the synthetic jet actuator at a target voltage and frequency, the initial feedback being received during a beginning of life of the synthetic jet actuator. The processor is further programmed to set a baseline value for each of the one or more operational parameters based on the received initial feedback and receive additional feedback from the sensing circuit comprising measurements of the one or more operational parameters of the synthetic jet actuator, the additional feedback on the one or more operational parameters resulting from operation of the synthetic jet actuator at the target voltage and frequency. The processor is further programmed to cause the synthetic jet actuator to be operated at an updated voltage and frequency based on a comparison of the measurements of the one or more operational parameters in the additional feedback and the measurements of the one or more operational parameters in the initial feedback.

In accordance with yet another aspect of the invention, a method for controlling operation of a synthetic jet actuator includes receiving an initial feedback from a sensing circuit comprising measurements of one or more operational parameters of a synthetic jet actuator, the measurements of the one or more operational parameters resulting from operation of the synthetic jet actuator at a target voltage and frequency, the initial feedback being received during a beginning of life of the synthetic jet actuator. The method also includes setting a baseline value for each of the one or more operational parameters based on the received initial feedback, receiving additional feedback from the sensing circuit comprising measurements of the one or more operational parameters of the synthetic jet actuator that results from operation of the synthetic jet actuator at the target voltage and frequency, and setting an operational box within which to operate the synthetic jet actuator based on a comparison of the measurements of the one or more operational parameters in the additional feedback and the measurements of the one or more operational parameters in the initial feedback, the operational box being defined by maximum acceptable power and voltage levels at which to operate the synthetic jet actuator. The method further includes determining an optimum voltage and frequency at which to operate the synthetic jet actuator that falls within the operational box.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

DETAILED DESCRIPTION

Embodiments of the invention provide an active control scheme for operating a synthetic jet actuator. The control scheme receives operational feedback from the synthetic jet actuator in order to identify degradation and a potential failure of the synthetic jet actuator. The control scheme also provides for adjustment of the operating parameters of the synthetic jet actuator to prolong the operational life of the synthetic jet actuator, with such adjustments also optimizing performance of the synthetic jet actuator with respect to meeting flow requirements and acoustic level requirements, in connection with or independent from any throttling down of the synthetic jet that is performed to prolong the operational life.

For purposes of better understanding aspects of the invention, an exemplary embodiment of a fluid mover—and of the operation thereof—is illustrated in FIGS. 1-4 that may be utilized in embodiments of the invention. It is recognized that embodiments of the invention are not meant to be limited to use of a specific fluid mover; however, in an exemplary embodiment, a vibration-type air mover (e.g., synthetic jet actuator) is utilized with the active control scheme described herein.

Figure 1:
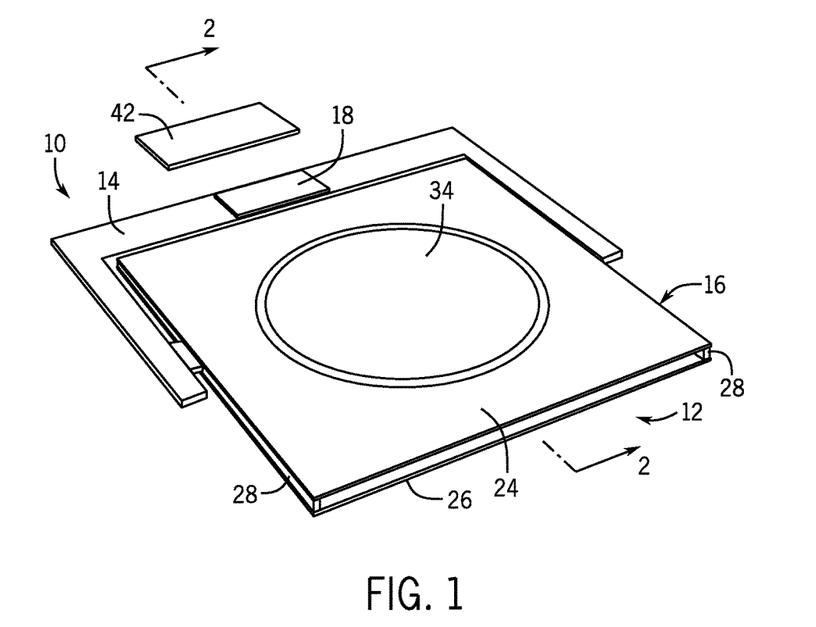
FIGS. 1 and 2 are views of a synthetic jet assembly useable with embodiments of the invention.
Figure 2:
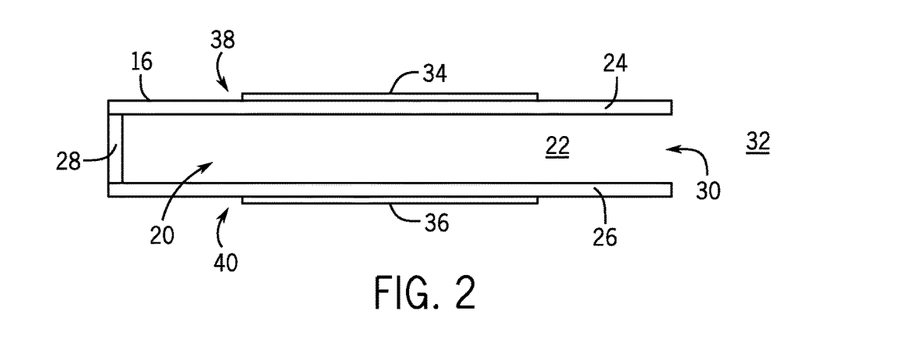

Referring first to FIG. 1, a perspective view of a vibration-type active cooling device in the form of a synthetic jet assembly 10 is provided. Synthetic jet assembly 10 includes a synthetic jet 12, a cross-section of which is illustrated in FIG. 2, and a mounting bracket 14. In one embodiment, mounting bracket 14 is a u-shaped bracket that is affixed to a housing 16 of synthetic jet 12 at one or more locations. A circuit driver 18 can be externally located or affixed to mounting bracket 14. Alternatively circuit driver 18 may be remotely located from synthetic jet assembly 10.

Referring now to FIGS. 1 and 2 together, housing 16 of synthetic jet 12 defines and partially encloses an internal chamber or cavity 20 having a gas or fluid 22 therein. While housing 16 and internal chamber 20 can take virtually any geometric configuration according to various embodiments of the invention, for purposes of discussion and understanding, housing 16 is shown in the cross-section view in FIG. 2 as including a first plate 24 and a second plate 26, which are maintained in a spaced apart relationship by a spacer element 28 positioned therebetween. One or more orifices 30 are formed between first and second plates 24, 26 and side walls of spacer element 28 in order to place the internal chamber 20 in fluid communication with a surrounding, exterior environment 32. In an alternative embodiment, spacer element 28 includes a front surface (not shown) in which one or more orifices 30 are formed.

According to various embodiments, first and second plates 24, 26 may be formed from a metal, plastic, glass, and/or ceramic. Likewise, spacer element 28 may be formed from a metal, plastic, glass, and/or ceramic. Suitable metals include materials such as nickel, aluminum, copper, and molybdenum, or alloys such as stainless steel, brass, bronze, and the like. Suitable polymers and plastics include thermoplastics such as polyolefins, polycarbonate, thermosets, epoxies, urethanes, acrylics, silicones, polyimides, and photoresist-capable materials, and other resilient plastics. Suitable ceramics include, for example, titanates (such as lanthanum titanate, bismuth titanate, and lead zirconate titanate) and molybdates. Furthermore, various other components of synthetic jet 12 may be formed from metal as well.

Actuators 34, 36 are coupled to respective first and second plates, 24, 26 to form first and second composite structures or flexible diaphragms 38, 40—such that the synthetic jet 12 is constructed as a "dual cool jet (DCJ)." The flexible diaphragms 38, 40 are controlled by driver 18 via a controller assembly or control unit system 42. As shown in FIG. 1, in one embodiment controller assembly 42 is electronically coupled to driver 18, which is coupled directly to mounting bracket 14 of synthetic jet 12. In an alternative embodiment, control system 42 is integrated into a driver 18 that is remotely located from synthetic jet 12. For example, each flexible diaphragm 38, 40 may be moved via an electrical bias imposed between the electrode and the metal layer. Moreover, control system 42 may be configured to generate the electrical bias by any suitable device, such as, for example, a computer, logic processor, or signal generator.

In one embodiment, actuators 34, 36 are piezoelectric motive (piezomotive) devices that may be actuated by application of a form of wave shape voltage (e.g., harmonic alternating voltage) that causes the piezomotive devices to rapidly expand and contract. During operation, control system 42 transmits an electric charge, via driver 18, to piezoelectric actuators 34, 36, which undergo mechanical stress and/or strain responsive to the charge. The stress/strain of piezomotive actuators 34, 36 causes deflection of respective first and second plates 24, 26 such that a time-harmonic or periodic motion is achieved. The resulting volume change in internal chamber 20 causes an interchange of gas or other fluid between internal chamber 20 and exterior environment 32, as described in detail with respect to FIGS. 3 and 4.

Piezomotive actuators 34, 36 may be monomorph or bimorph devices, according to various embodiments of the invention. In a monomorph embodiment, piezomotive actuators 34, 36 may be coupled to plates 24, 26 formed from materials including metal, plastic, glass, or ceramic. In a bimorph embodiment, one or both piezomotive actuators 34, 36 may be bimorph actuators coupled to plates 24, 26 formed from piezoelectric materials. In an alternate embodiment, the bimorph may include single actuators 34, 36 and plates 24, 26 are second actuators.

The components of synthetic jet 12 may be adhered together or otherwise attached to one another using adhesives, solders, and the like. In one embodiment, a thermoset adhesive or an electrically conductive adhesive is employed to bond actuators 34, 36 to first and second plates 24, 26 to form first and second composite structures 38, 40. In the case of an electrically conductive adhesive, an adhesive may be filled with an electrically conductive filler such as silver, gold, and the like, in order to attach lead wires (not shown) to synthetic jet 12.

In an embodiment of the invention, actuators 34, 36 may include devices other than piezoelectric motive devices, such as hydraulic, pneumatic, magnetic, electrostatic, and ultrasonic materials. Thus, in such embodiments, control system 42 is configured to activate respective actuators 34, 36 in corresponding fashion. For example, if electrostatic materials are used, control system 42 may be configured to provide a rapidly alternative electrostatic voltage to actuators 34, 36 in order to active and flex respective first and second plates 24, 26.

Figure 3:
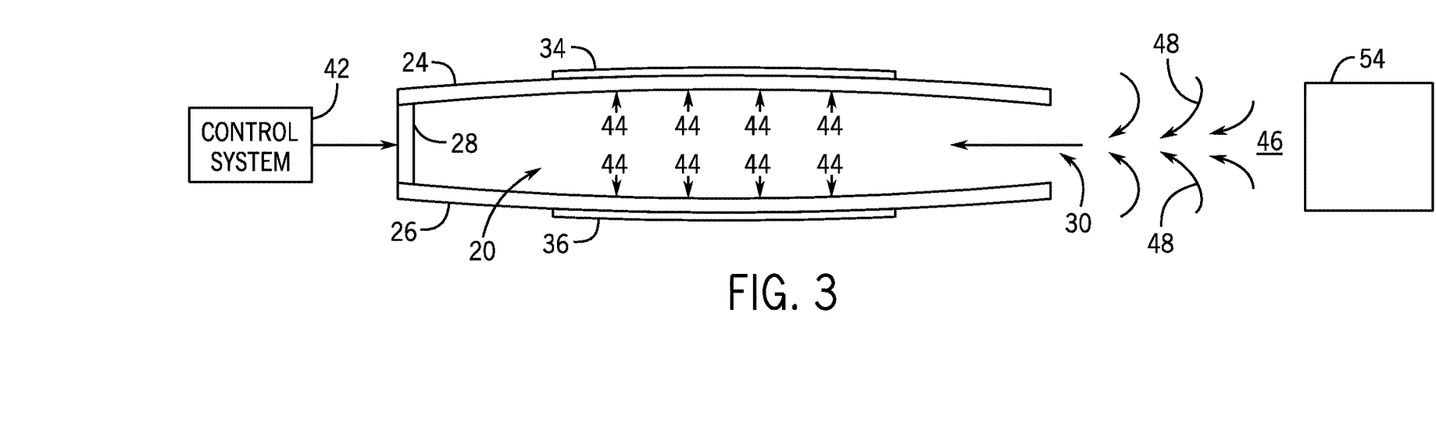
FIG. 3 is a cross-section of the synthetic jet of FIGS. 1 and 2 depicting the jet as the control system causes the diaphragms to travel inward, toward the orifice.

The operation of synthetic jet 12 is described with reference to FIGS. 3 and 4. In FIG. 3, synthetic jet 12 is illustrated as actuators 34, 36 are controlled to cause first and second plates 24, 26 to move outward with respect to internal chamber 20, as depicted by arrows 44. As first and second plates 24, 26 flex outward, the internal volume of internal chamber 20 increases, and ambient gas or fluid 46 rushes into internal chamber 20 as depicted by the set of arrows 48. Actuators 34, 36 are controlled by control system 42 so that when first and second plates 24, 26 move outward from internal chamber 20, vortices are already removed from edges of orifice 30 and thus are not affected by the ambient fluid 46 being drawn into internal chamber 20. Meanwhile, a jet of ambient fluid 46 is synthesized by vortices creating strong entrainment of ambient fluid 46 drawn from large distances away from orifice 30.

Figure 4:
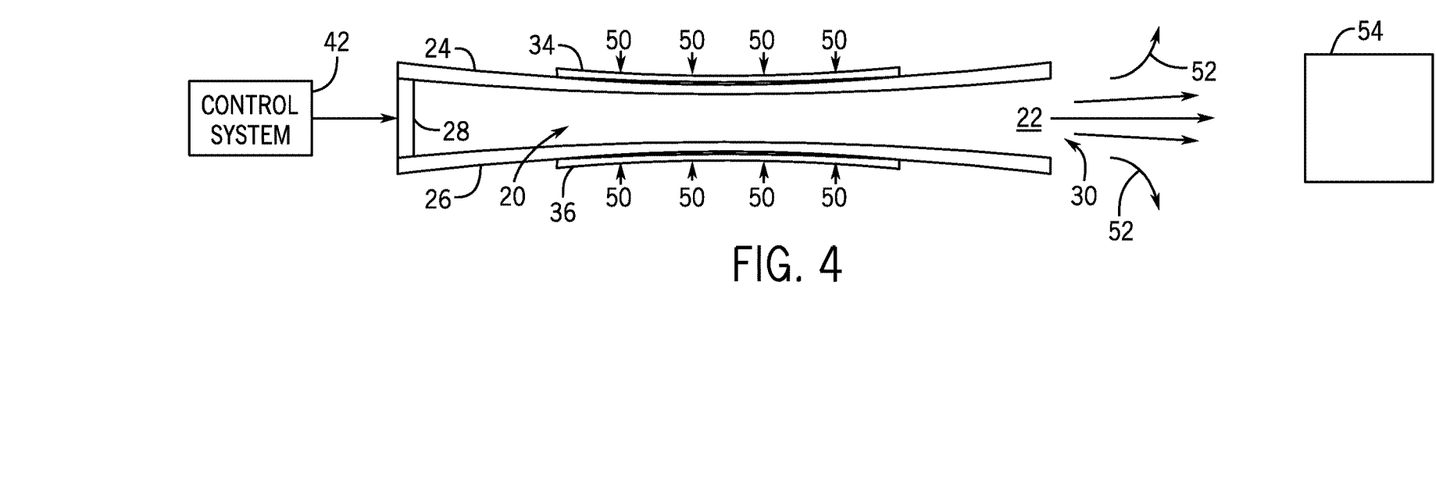
FIG. 4 is a cross-section of the synthetic jet of FIGS. 1 and 2 depicting the jet as the control system causes the diaphragms to travel outward, away from the orifice.

FIG. 4 depicts synthetic jet 12 as actuators 34, 36 are controlled to cause first and second plates 24, 26 to flex inward into internal chamber 20, as depicted by arrows 50. As the internal volume of internal chamber 20 decreases, fluid 22 is ejected as a cooling jet through orifice 30 in the direction indicated by the set of arrows 52 toward a device to be cooled, such as, for example, a heat generating electronic component. As fluid 22 exits internal chamber 20 through orifice 30, the flow separates at the sharp edges of orifice 30 and creates vortex sheets which roll into vortices and begin to move away from edges of orifice 30.

While the synthetic jet of FIGS. 1-4 is shown and described as having a single orifice therein, it also envisioned that embodiments of the invention may include multiple orifice synthetic jet actuators. Additionally, while the synthetic jet actuators of FIGS. 1-4 are shown and described as having an actuator element included on each of first and second plates, it is also envisioned that embodiments of the invention may include only a single actuator element positioned on one of the plates. Furthermore, it is also envisioned that the synthetic jet plates may be provided in a circular, rectangular, or alternatively shaped configurations, rather than in a square configuration as illustrated herein.

Figure 5:
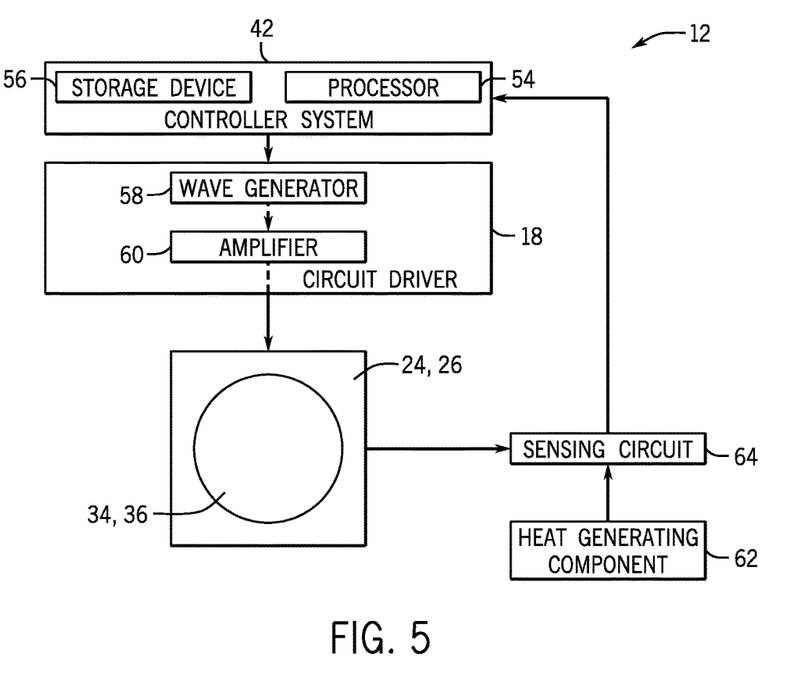
FIG. 5 is a block diagram of the synthetic jet of FIGS. 1-4, and means for providing feedback on the operation thereof, according to an embodiment of the invention.

Referring now to FIG. 5, and with continued reference back to FIGS. 1-4, a block diagram of the synthetic jet 12 is provided in order to introduce an active control scheme for operating the synthetic jet, according to an embodiment of the invention. As shown in FIG. 5, control system 42 includes a processor 54 and memory 56 for the processing and storage of operational data this is collected on the synthetic jet 12. The driver 18 includes a wave generator 58 and amplifier 60 therein that generate a form of wave shape voltage (based on an input received from controller unit 42) that is applied to the piezoelectric actuators 34, 36 of the synthetic jet 12. The voltage provided from the driver 18 causes the actuators 34, 36 to undergo mechanical stress and/or strain responsive to the charge, such that a time-harmonic or periodic motion of plates 24, 26 is achieved to alternately entrain fluid into the synthetic jet 12 and eject a cooling jet of fluid from the synthetic jet 12—with the cooling jet of fluid being directed toward a heat generating component 62.

While driver 18 is shown in FIG. 5 as being a separate component from control system 42, it is recognized that control system and driver 18 may be integrated together into a single device/control system, with the functions of the control system 42 and driver 18 being performed by the single device.

In order to provide for active control of the synthetic jet 12, a sensing circuit 64 is provided that monitors operation of the synthetic jet by measuring one or more operational parameters thereof and provides feedback of the measured operational parameters to the control system 42. In an exemplary embodiment, sensing circuit 64 senses a current generated by the vibration of the synthetic jet 12 and outputs a feedback signal to the control system 42 based on the collected current data. As will be explained in greater detail below, the control system 42 is programmed to compare the current data acquired from the synthetic jet 12 during operation thereof and compare it to previously acquired baseline current data from the synthetic jet 12 in order to assess the health of the synthetic jet 12 and predict a potential failure that might occur. According to one embodiment, sensing circuit 64 is further configured to sense an operating temperature of the heat generating component 62

Figure 6:
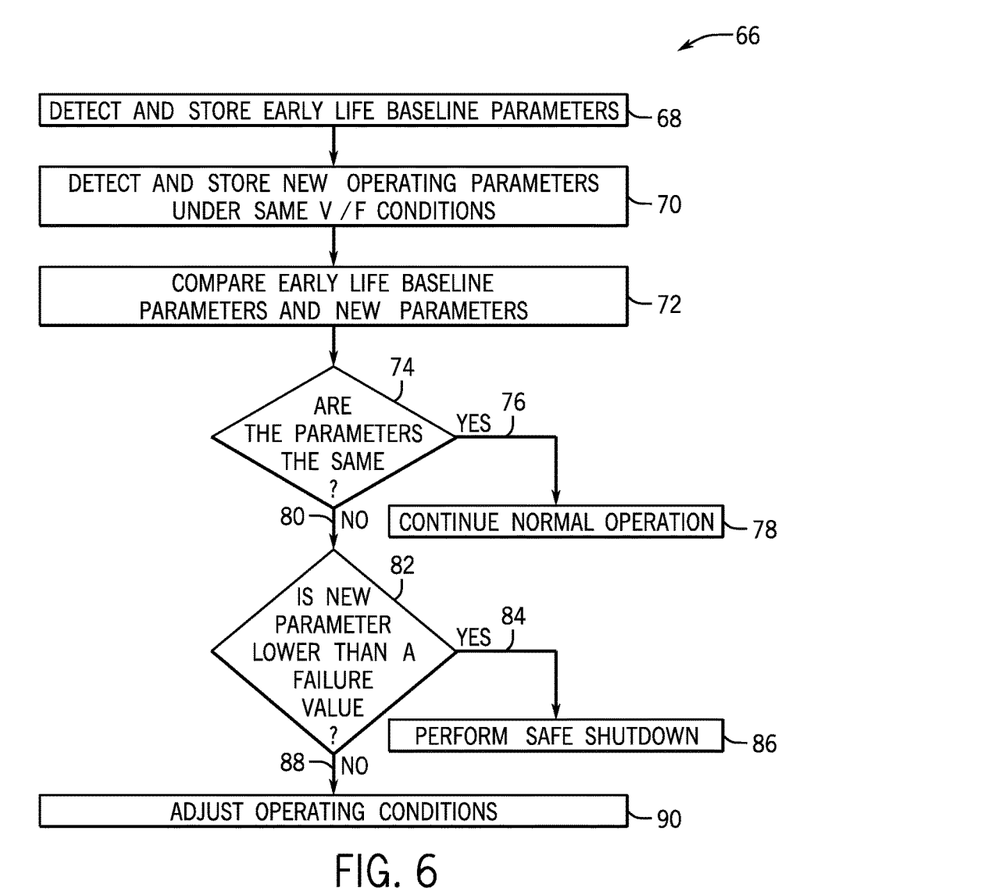
FIG. 6 is a block diagram depicting a technique for optimizing the lifespan of a synthetic jet actuator, according to an embodiment of the invention.

Referring now to FIG. 6, and with continued reference back to FIGS. 1-5, a technique 66 for actively controlling a synthetic jet in order to optimize the lifespan thereof—such as may be implemented by control system 42—is provided. In starting technique 66, initial baseline operational data of the synthetic jet is first acquired and stored (e.g., in memory 56) at STEP 68. According to an exemplary embodiment of the invention, the baseline operational data includes a target operating voltage and frequency (i.e., a wave shape voltage at a desired frequency) that are provided to the synthetic jet 12 via driver 18, and a resulting current value from the synthetic jet 12 that is sensed by sensing circuit 64 responsive to the target operating voltage and frequency that are provided to the synthetic jet 12. According to one embodiment, the baseline operational data also includes a measure of the operating temperature of the heat generating component 62 that is maintained based on the target operating voltage and frequency that are provided to the synthetic jet 12. It is recognized that the baseline operational data is collected at a beginning of life of the synthetic jet 12, e.g., first use after installation, such that it can safely be presumed that the synthetic jet 12 is in a "healthy" condition whose performance is not degraded in any fashion. Acquisition of the baseline operational data while the synthetic jet 12 is healthy will thus provide a basis for comparison later on when additional operational data is collected from the synthetic jet 12 while the synthetic jet may be in a degraded condition.

Upon acquisition and storage of the baseline operational data, the technique 66 continues at STEP 70 where, at some later time and during operation of the synthetic jet 12, operational data of the synthetic jet 12 is again acquired—either in a periodic fashion (e.g., measurements made every hour) or a dynamic/continuous fashion. The operational data from the synthetic jet 12 that is acquired at STEP 70 is for the same operational parameters that were previously acquired at STEP 68, and thus includes the target operating voltage and frequency that are provided to the synthetic jet 12 via driver 18, and a resulting current value from the synthetic jet 12 that is sensed by sensing circuit 64 responsive to the target operating voltage and frequency that are provided to the synthetic jet 12. Additionally, the operating temperature of the heat generating component 62 may again be measured that is resulting from the synthetic jet 12 being run at the target operating voltage and frequency. It is recognized that, in acquiring the operational data at STEP 70, the same target operating voltage and frequency that are provided to the synthetic jet 12 at STEP 68 should again be provided to the synthetic jet 12 at STEP 70, in order to provide an accurate comparison of operational parameters.

Next, at STEP 72 a comparison between the baseline operational data acquired at STEP 68 and the additional operational data acquired at STEP 70 is performed, in order to identify whether the performance of the synthetic jet has degraded over time—which may be an indication of a potential premature failure of the synthetic jet. According to an exemplary embodiment, baseline current data sensed by sensing circuit 64 (responsive to vibration of the synthetic jet 12) at STEP 68—corresponding to target operating voltage and frequency provided to the synthetic jet 12 during baseline operational data acquisition—is compared to current data sensed by sensing circuit 64 at STEP 70—corresponding to the same target operating voltage and frequency provided to the synthetic jet 12 during the additional operational data acquisition. According to one embodiment, temperature data sensed by sensing circuit 64 at STEPS 68 and 70 may also be compared.

It is then determined at STEP 74 whether the baseline operational data acquired at STEP 68 and the additional operational data acquired at STEP 70 are the same. If it is determined at STEP 74 that the operational data acquired at STEPS 68 and 70—i.e., the current measurements collected from synthetic jet 12 by sensing circuit 64, and potentially the temperature measurements collected by sensing circuit 64—are the same, as indicated at 76, then the technique determines that the synthetic jet 12 has not degraded (i.e., no drop in performance or operating efficiency). The technique thus continues to STEP 78, with the control system 42 and the driver 18 functioning to operate the synthetic jet 12 in a "normal" operating mode—with the synthetic jet being operated at a target voltage and frequency as desired by an operator in order to achieve a desired acoustic noise level and maintain the heat generating component at a desired temperature.

If, however, it is determined at STEP 74 that the operational data acquired at STEPS 68 and 70—i.e., the current measurements collected from synthetic jet 12 by sensing circuit 64, and potentially the temperature measurements collected by sensing circuit 64—are not the same, as indicated at 80, then the technique determines that the synthetic jet 12 has degraded (i.e., the performance or operating efficiency has dropped). In practice, this means that the current measurements collected from synthetic jet 12 by sensing circuit 64 at STEP 70 would be decreased as compared to the current measurements collected at STEP 68 and/or the temperature measured by sensing circuit 64 at STEP 70 would be increased as compared to the temperature measured at STEP 68.

If it is determined at STEP 74 that the operational data acquired at STEPS 68 and 70 are not the same, the technique then continues to STEP 82, with a subsequent determination being made as to whether the operational data acquired at STEP 70 is at a threshold level. More specifically, the current measurements collected from synthetic jet 12 by sensing circuit 64 at STEP 70 are compared to a current threshold value that would be indicative of a failure of the synthetic jet—in order to determine if operation of the synthetic jet 12 may be safely continued according to a "throttled down" operating mode/procedure or if an imminent safe shut-down procedure needs to be implemented for the synthetic jet.

If it is determined at STEP 82 that the current measurements collected from synthetic jet 12 by sensing circuit 64 at STEP 70 are below the current threshold, as indicated at 84, it is determined that a failure of the synthetic jet is imminent. Technique 66 therefore continues at STEP 86 with a "failure flag" being generated by the control system 42 that provides for a safe shut-down procedure to be initiated/implemented by the control system 42—such as a controlled ramp-down of the synthetic jet 12 being performed to shut-off.

Conversely, if it is determined at STEP 82 that the current measurements collected from synthetic jet 12 by sensing circuit 64 at STEP 70 are above the current threshold, as indicated at 86, it is determined that the synthetic jet 12 can continue to operate without a failure being imminent, but that the synthetic jet should be operated in a "throttled" fashion in order to extend the life of the synthetic jet. Accordingly, the technique continues at STEP 90 where a "throttling flag" is generated by the control system 42 that initiates/implements a determination of a new set of optimal throttle-down operating conditions for the synthetic jet 12, with the control system 42 functioning to implement the throttled-down operation of the synthetic jet 12.

Figure 7:
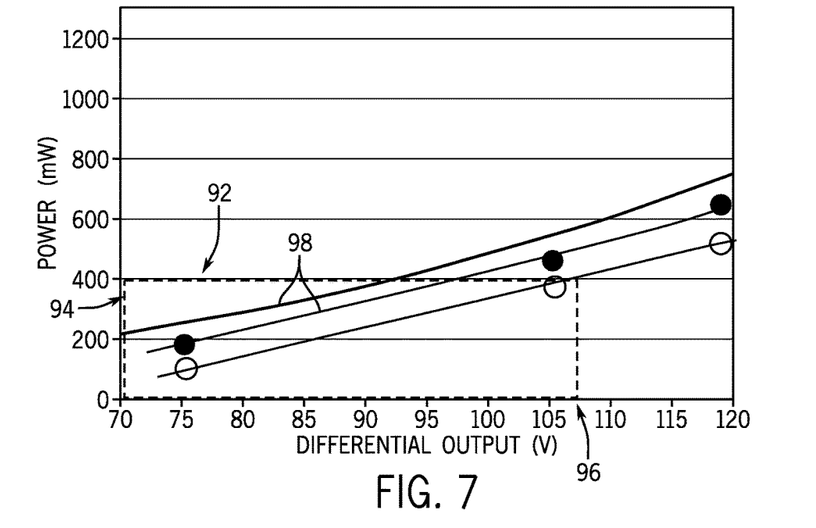
FIG. 7 is a graph illustrating an operational box defined by power and voltage limits, within which to operate a synthetic jet actuator to optimize the lifespan thereof

In implementing the throttling-down of the synthetic jet 12 at STEP 90, the control system 42 functions to determine an "operating box" within which the synthetic jet 12 may be safely operated so as to prolong the life thereof. FIG. 7 displays an operating box 92 within which the synthetic jet 12 may be operated—with the operating box being defined by a maximum power (wattage) and maximum differential voltage at which the synthetic jet may be operated, indicated at 94 and 96, respectively.

According to an exemplary embodiment, with respect to the determining of a maximum wattage at which the synthetic jet 12 should be operated, controller 42 not only determines a differential voltage at which the synthetic jet should be operated to maintain operation within the operating box—but also determines an optimum frequency at which to operate the synthetic jet 12 in order to operate the synthetic jet at a desirable acoustic level and at a desirable flow rate (so as to maintain the heat generating component at a desired/required temperature). With respect to the operation of the synthetic jet 12, it is recognized that various voltage/frequency combinations are possible that operate the synthetic jet 12 below a maximum wattage set for the throttled operation, as indicated by the voltage vs. frequency curves 98 in FIG. 7 (at 120 Hz, 150 Hz, and 175 Hz, for example), and controller 42 is programmed to identify an optimum voltage/frequency combination at which to operate the synthetic jet in order to achieve a desired acoustic level and flow rate.

Figure 8:
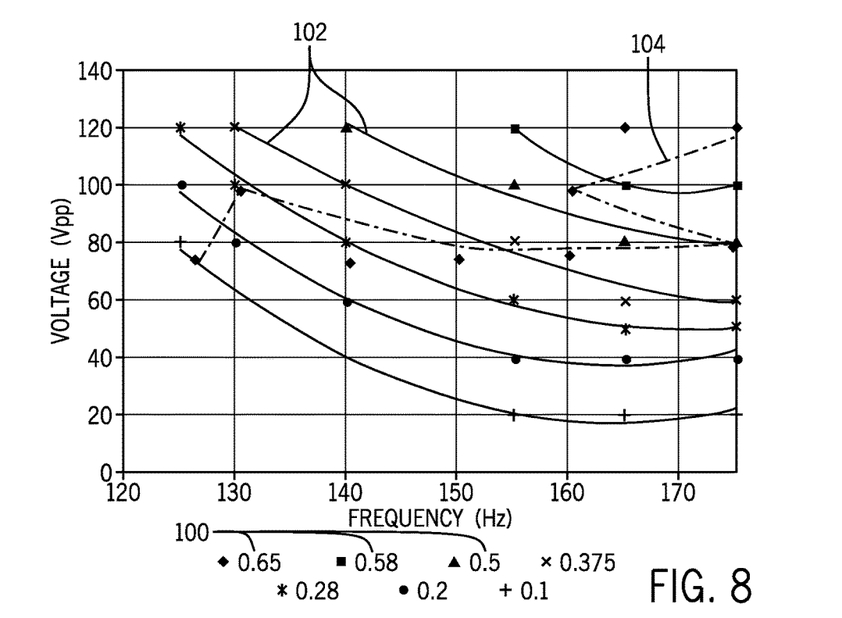
FIG. 8 is a graph illustrating voltage vs. frequency curves for various flow rates for operating a synthetic jet actuator.

Referring now to FIG. 8, a graph is provided depicting a number of flow rates 100 at which the synthetic jet could be operated to provide desired/necessary cooling to a heat generating component. As can be seen in FIG. 8, each of the flow rates 100 can be achieved via a number of different voltage (peak-to-peak, Vpp)—frequency combinations at which the synthetic jet 12 may be operated. These different voltage-frequency combinations generally define a supplied data set at which the synthetic jet 12 may be operated in order to achieve a desired flow rate. According to an exemplary embodiment, the supplied data set is in the form of an operational curve 102 along which the synthetic jet 12 may be operated. The frequency and voltage operating conditions of the synthetic jet 12 can be adjusted along a particular curve 102 to maintain the same flow rate, while operating synthetic jet actuator at ideal operating voltage/frequency conditions—such as a voltage condition that would fit within operating box 92 (FIG. 7). Additionally, FIG. 8 shows a sound pressure curve/line 104. The sound pressure curve 104 presents a guide for the acoustic noise produced at certain voltage and frequency operating conditions. As a result, FIG. 8 presents a visual determination of optimal frequency and voltage operating combinations that result in an optimal synthetic jet actuator flow rate within the limits of a preferred acoustic noise level.

While the determining of optimum frequency and differential voltage values at which to operate the synthetic jet 12 are discussed above with relation to a throttling-down performed at STEP 90 in the technique 66 of FIG. 5, it is recognized that such determining optimum frequency and voltage values at which to operate the synthetic jet 12 could be performed independent from any identification/prevention of potential failures in the synthetic jet. That is, control system 42 could operate to determine optimum frequency and differential voltage values at which to operate the synthetic jet 12 solely for purposed of minimizing acoustic noise levels to the extent possible while still achieving a desired/required flow rate. In doing so, control system 42 could refer to the voltage vs. frequency curves illustrated in FIG. 8 for determining such optimal voltage/frequency values.

Beneficially, embodiments of the invention thus provide an active control scheme for operating a synthetic jet actuator. The control scheme receives operational feedback from the synthetic jet actuator in order to identify degradation and a potential failure of the synthetic jet actuator and adjusts the operating parameters of the synthetic jet actuator to prolong the operational life of the synthetic jet actuator. The control scheme further is able to optimize performance of the synthetic jet actuator with respect to meeting flow requirements and acoustic level requirements, in connection with or independent from any throttling down of the synthetic jet that is performed to prolong the operational life.

A technical contribution for the disclosed method and apparatus is that it provides for a controller implemented technique for actively controlling a synthetic jet actuator. The technique is performed by a controller that receives operational feedback from the synthetic jet in order to identify potential degradation thereof and determine optimized parameter values at which to operate the synthetic jet.

Therefore, according to one embodiment of the invention, a vibrational fluid mover includes a housing defining a chamber, the housing having at least one orifice formed therein. The vibrational fluid mover also includes at least one actuator element positioned on the housing that moves in a time harmonic fashion responsive to a form of wave shape voltage applied thereto, such that a volume of the chamber increases and decreases to entrain fluid into the chamber and eject a jet of fluid out from the at least one orifice. The vibrational fluid mover further includes a control system operably connected to the at least one actuator element to cause the form of wave shape voltage to be provided thereto so as to actively control the time harmonic movement of the at least one actuator element, wherein the control system is programmed to set a baseline value for an operational parameter of the vibrational fluid mover generated responsive to a target voltage and frequency being provided to the at least one actuator element, monitor operation of the vibrational fluid mover during continued operation thereof at the target voltage and frequency, identify a deviation of the operational parameter from the baseline value during the continued operation thereof at the target voltage and frequency, and modify the voltage and frequency provided to the at least one actuator element based on the identified deviation of the operational parameter from the baseline value.

According to another embodiment of the invention, a control system for providing active control of a synthetic jet actuator includes a processor programmed to receive an initial feedback from a sensing circuit comprising measurements of one or more operational parameters of a synthetic jet actuator, the measurements of the one or more operational parameters resulting from operation of the synthetic jet actuator at a target voltage and frequency, the initial feedback being received during a beginning of life of the synthetic jet actuator. The processor is further programmed to set a baseline value for each of the one or more operational parameters based on the received initial feedback and receive additional feedback from the sensing circuit comprising measurements of the one or more operational parameters of the synthetic jet actuator, the additional feedback on the one or more operational parameters resulting from operation of the synthetic jet actuator at the target voltage and frequency. The processor is further programmed to cause the synthetic jet actuator to be operated at an updated voltage and frequency based on a comparison of the measurements of the one or more operational parameters in the additional feedback and the measurements of the one or more operational parameters in the initial feedback.

According to yet another embodiment of the invention, a method for controlling operation of a synthetic jet actuator includes receiving an initial feedback from a sensing circuit comprising measurements of one or more operational parameters of a synthetic jet actuator, the measurements of the one or more operational parameters resulting from operation of the synthetic jet actuator at a target voltage and frequency, the initial feedback being received during a beginning of life of the synthetic jet actuator. The method also includes setting a baseline value for each of the one or more operational parameters based on the received initial feedback, receiving additional feedback from the sensing circuit comprising measurements of the one or more operational parameters of the synthetic jet actuator that results from operation of the synthetic jet actuator at the target voltage and frequency, and setting an operational box within which to operate the synthetic jet actuator based on a comparison of the measurements of the one or more operational parameters in the additional feedback and the measurements of the one or more operational parameters in the initial feedback, the operational box being defined by maximum acceptable power and voltage levels at which to operate the synthetic jet actuator. The method further includes determining an optimum voltage and frequency at which to operate the synthetic jet actuator that falls within the operational box.

While the invention has been described in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A vibrational fluid mover comprising:
   a housing defining a chamber, the housing having at least one orifice formed therein;
   at least one actuator element positioned on the housing that moves in a time harmonic fashion responsive to a form of wave shape voltage applied thereto, such that a volume of the chamber increases and decreases to entrain fluid into the chamber and eject a jet of fluid out from the at least one orifice;
   a control system operably connected to the at least one actuator element to cause the form of wave shape voltage to be provided thereto so as to actively control the time harmonic movement of the at least one actuator element, wherein the control system is programmed to:
      set a baseline value for a current generated by the vibration of the at least one actuator element responsive to a target voltage and frequency being provided to the at least one actuator element;
      monitor operation of the vibrational fluid mover during continued operation thereof at the target voltage and frequency;
      identify a deviation of the current from the baseline value during the continued operation thereof at the target voltage and frequency;
      assess a health of the vibrational fluid mover and predict a potential failure of the vibrational fluid mover that might occur based on the identified deviation; and
      modify the voltage and frequency provided to the at least one actuator element based on the identified deviation of the current from the baseline value; and
   a sensing circuit configured to:
      measure the current generated responsive to the target voltage and frequency being provided to the at least one actuator element and
      provide feedback on a measured value of the current to the control system, so as to provide for the monitoring of the vibrational fluid mover;
   wherein, in modifying the voltage and frequency provided to the at least one actuator element, the control system is further programmed to:
      determine a value of the current measured by the sensing circuit;
      initiate a controlled shut down of the vibrational fluid mover if the value of the measured current is less than a pre-determined current threshold; and
      initiate a throttled-down operating mode for the vibrational fluid mover if the value of the measured current is greater than the current threshold, the throttled-down operating mode altering a value of the voltage provided to the at least one actuator element.

2. The vibrational fluid mover of claim 1 wherein the control system is further programmed to alter the value of the voltage provided to the at least one actuator element so as to operate the at least one actuator element within an operating box defined by maximum acceptable power and differential voltage levels.

3. The vibrational fluid mover of claim 1 wherein the control system is further programmed to set the baseline value of the operational parameter based on measurements thereof received from the sensing circuit during operation of the vibrational fluid mover at a first use thereof.

4. The vibrational fluid mover of claim 1 wherein, in modifying the voltage and frequency provided to the at least one actuator element, the control system is further programmed to identify an optimum voltage and frequency to provide to the at least one actuator element to achieve a desired flow rate and acoustic noise level by the vibrational fluid mover.

5. The vibrational fluid mover of claim 4 wherein the optimum voltage and frequency is selected from a supplied data set for the desired flow rate.

6. The vibrational fluid mover of claim 5 wherein the supplied data set comprises a flow rate curve.

7. A control system for providing active control of a synthetic jet actuator, the control system comprising a processor programmed to:
   receive an initial feedback from a sensing circuit comprising measurements of one or more operational parameters of the synthetic jet actuator, the measurements of the one or more operational parameters resulting from operation of the synthetic jet actuator at a target voltage and frequency, the initial feedback being received during a first use thereof of the synthetic jet actuator;
   set a baseline value for each of the one or more operational parameters based on the received initial feedback;
   receive additional feedback from the sensing circuit comprising measurements of the one or more operational parameters of the synthetic jet actuator, the additional feedback on the one or more operational parameters resulting from operation of the synthetic jet actuator at the target voltage and frequency;
   set an operational box within which to operate the synthetic jet actuator based on a comparison of the measurements of the one or more operational parameters in the additional feedback and the measurements of the one or more operational parameters in the initial feedback, the operational box being defined by maximum acceptable power and voltage levels at which to operate the synthetic jet actuator; and cause the synthetic jet actuator to be operated at an updated voltage and frequency based on a comparison of the measurements of the one or more operational parameters in the additional feedback and the measurements of the one or more operational parameters in the initial feedback, the updated voltage and frequency falling within the operational box;

wherein, in causing the synthetic jet actuator to be operated at an updated voltage and frequency, the processor is further programmed to:

identify a degraded operating performance of the synthetic jet actuator based on the comparison of the measurements of the one or more operational parameters in the additional feedback and the measurements of the one or more operational parameters in the initial feedback, with the processor being programmed to identify a deviation of the one or more operational parameters from the baseline value from the additional feedback; and predict a potential failure of the vibrational fluid mover that might occur based on the identified deviation.

8. The control system of claim 7 wherein the one or more operational parameters comprises a current generated by vibration of the synthetic jet actuator, with the processor being programmed to identify a deviation of the current from a baseline current value; and wherein the processor is further programmed to:

compare the measured current from the additional feedback to a failure current threshold;

initiate a controlled shut down of the synthetic jet actuator if the measured current is less than the failure current threshold; and initiate a throttled-down operating mode for the synthetic jet actuator if the measured current is greater than the current threshold, the throttled-down operating mode altering at least one of a voltage or frequency provided to the at least one actuator element so as to operate the synthetic jet actuator within the operating box.

9. The control system of claim 7 wherein, in causing the synthetic jet actuator to be operated at an updated voltage and frequency, the processor is further programmed to identify an optimum voltage and frequency to provide to the at least one actuator element to achieve at least one of a desired flow rate and an acoustic noise level by the synthetic jet actuator.

10. The control system of claim 9 wherein the processor is further programmed to select the optimum voltage and frequency from a supplied data set for the desired flow rate.

11. The control system of claim 7 wherein the one or more operational parameters comprises a temperature of a heat generated component being cooled by the vibrational fluid mover.

12. A method for controlling operation of a synthetic jet actuator, the method comprising:

receiving, via a control system operably connected to the synthetic jet actuator, an initial feedback from a sensing circuit comprising measurements of one or more operational parameters of a synthetic jet actuator, the measurements of the one or more operational parameters resulting from operation of the synthetic jet actuator at a target voltage and frequency, the initial feedback being received during a first use thereof of the synthetic jet actuator;

setting, via the control system, a baseline value for each of the one or more operational parameters based on the received initial feedback;

receiving, via the control system, additional feedback from the sensing circuit comprising measurements of the one or more operational parameters of the synthetic jet actuator, the additional feedback on the one or more operational parameters resulting from operation of the synthetic jet actuator at the target voltage and frequency;

setting, via the control system, an operational box within which to operate the synthetic jet actuator based on a comparison of the measurements of the one or more operational parameters in the additional feedback and the measurements of the one or more operational parameters in the initial feedback, the operational box being defined by maximum acceptable power and voltage levels at which to operate the synthetic jet actuator; and determining, via the control system, an optimum voltage and frequency at which to operate the synthetic jet actuator that falls within the operational box.

13. The method of claim 12 wherein the one or more operational parameters comprises a current of the synthetic jet actuator, and wherein the method further comprises:

operating the synthetic jet actuator at the same target voltage and frequency if a measured current from the additional feedback is equal to a baseline current value; and operating the synthetic jet actuator at a modified voltage and frequency if the measured current from the additional feedback deviates from the baseline current value;

wherein operating the synthetic jet actuator at a modified voltage and frequency comprises:

comparing the measured current from the additional feedback to a failure current threshold;

initiating a controlled shut down of the synthetic jet actuator if the measured current is less than the failure current threshold; and initiating a throttled-down operating mode for the synthetic jet actuator if the measured current is greater than the current threshold, the throttled-down operating mode altering the voltage or so as to operate the synthetic jet actuator within the operating box.

14. The method of claim 12 wherein determining an optimum voltage and frequency at which to operate the synthetic jet actuator comprises selecting an optimum voltage and frequency from a supplied data set for a desired flow rate.

* * * * *